United States Patent [19]

Saitoh

[11] 4,169,271

[45] Sep. 25, 1979

[54] SEMICONDUCTOR DEVICE INCLUDING A THERMAL FUSE ENCAPSULATED IN A DROPLET OF SILICONE RUBBER

[75] Inventor: Yoshiaki Saitoh, Kawasaki, Japan

[73] Assignee: Tokyo Shibaura Electric Co., Ltd., Japan

[21] Appl. No.: 865,491

[22] Filed: Dec. 29, 1977

[30] Foreign Application Priority Data

Jan. 27, 1977 [JP] Japan .................................. 52-7228

[51] Int. Cl.² .................... H01L 27/02; H01L 23/48; H01L 29/44
[52] U.S. Cl. ........................................ 357/51; 357/70; 357/72; 357/76; 357/81; 339/275 C
[58] Field of Search ................... 357/72, 76, 74, 51, 357/81, 70; 252/512; 339/275

[56] References Cited

U.S. PATENT DOCUMENTS

| | | | |
|---|---|---|---|
| 2,979,644 | 4/1961 | Salzer | 357/76 |
| 3,451,609 | 6/1969 | Gillett | 339/275 |
| 3,777,297 | 12/1973 | Knapp | 357/51 |
| 3,832,606 | 8/1974 | Furnival | 357/51 |
| 3,974,105 | 8/1976 | Sato et al. | 352/512 |

*Primary Examiner*—Andrew J. James
*Attorney, Agent, or Firm*—Finnegan, Henderson, Farabow & Garrett

[57] ABSTRACT

A semiconductor device of this invention comprises a semiconductor chip including a high power consumption portion, an internal lead wire connecting an electrode portion of the semiconductor chip with an external terminal, a soft material adhered to a substantially middle portion of the lead wire, and a moulding material for integrally moulding the semiconductor chip, lead wire, and soft material. Further, the semiconductor device includes a thermal fuse to prevent flaming of the device by cutting off the lead wire within the soft material in case the device is subjected to overcurrent.

13 Claims, 5 Drawing Figures

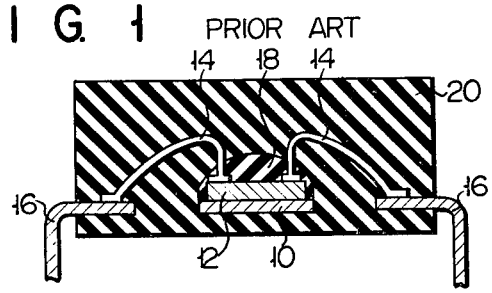
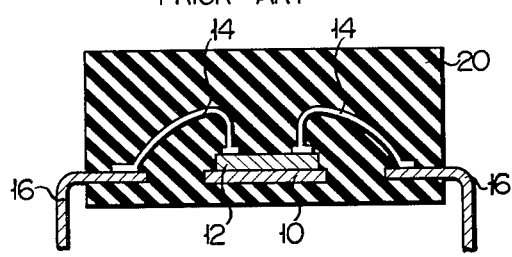
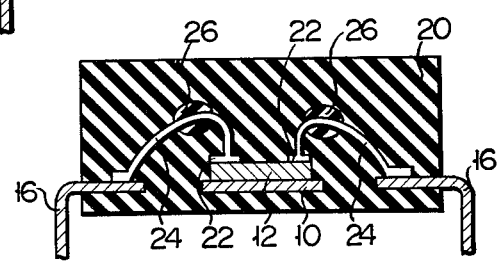
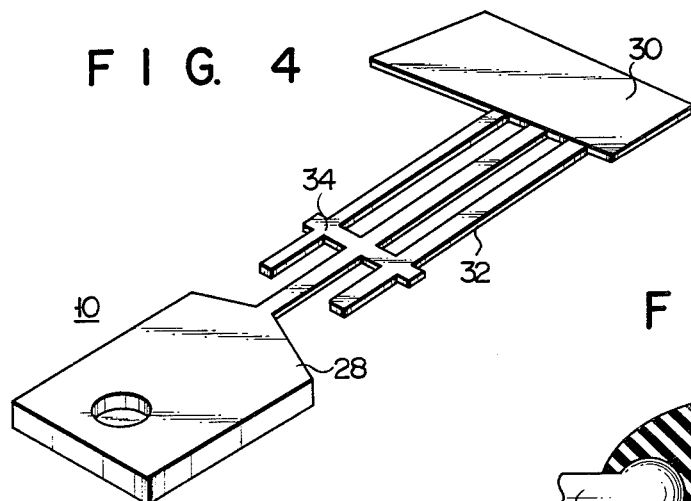
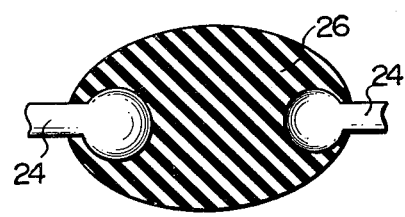

SEMICONDUCTOR DEVICE INCLUDING A THERMAL FUSE ENCAPSULATED IN A DROPLET OF SILICONE RUBBER

This invention relates to a semiconductor device including a thermal fuse for preventing flaming hazards peculiar to moulding type semiconductor devices.

In semiconductor devices including a high power consumption portion, such as discrete power transistors and integrated circuits or large scale integrated circuits for power amplifier, active and passive elements of a semiconductor chip are separately connected with external terminals by means of internal lead wires within the package. In this type of semiconductor device the semiconductor chip is mounted on a metallic mounting member, a part of which may be used for the internal lead wire. The general methods for integrating the external terminals, internal lead wires, and semiconductor chip include a method in which they are enclosed by a metal can and a method in which they are enclosed by resin moulding. The semiconductor device with the metal can type package, however, costs higher as compared with one employing the resin moulding type package, so that the latter is more often used. The semiconductor chip used with such semiconductor device may be prepared by the conventional semiconductor manufacturing technique.

Referring now to FIG. 1, there will be described an example of the construction of the prior art moulding type semiconductor device. On a mounting member 10 is mounted a semiconductor chip 12 including a high power consumption portion. Fixed electrode portions on the chip 12 are separately connected with external terminals 16 by means of internal lead wires 14. The chip 12 is covered with a soft resin 18 for preventing the degeneration of the chip affected by the moulding resin and the like. Thereafter, the member 10, chip 12, wire 14, terminal 16 and resin 18 are integrally moulded by a moulding resin 20. The aforementioned moulding structure is applicable to any of the discrete transistors and integrated circuits or large scale integrated circuits. However, the coefficient of thermal expansion of the wire 14 is substantially different from that of the resin 18. Therefore, if the semiconductor device is subjected to thermal cycles accompanying the repeated start and stop of its operation, bonding between an electrode portion of the chip 12 and the wire 14 will often be broken by the stress caused due to the different coefficients of thermal expansion and contraction.

In order to avoid the aforesaid contact failure, there is proposed a semiconductor device with construction such as that shown in FIG. 2. In this construction the resin 18 may be omitted by making use of such a resin that can mould the member 10, chip 12, wire 14 and terminal 16 while maintaining the chemical stability of the surface of the semiconductor chip 12. Thus, there may be avoided the above-mentioned contact failure attributable to the difference between the coefficients of thermal expansion of the wire 14 and resin 18. Either of the constructions shown in FIGS. 1 and 2, however, are subject to the following significant shortcoming. In those semiconductor devices which include a portion to deal with a power consumption of approximately 1 watt or higher, if any abnormal operating condition (e.g., a condition with ordinary power supply in which an input signal is applied from the output terminal of a short circuited power amplifier circuit) is brought about, then a large current will flow from the power circuit into the semiconductor chip 12. This large current, i.e., overcurrent, extraordinarily overheats the chip 12 and wire 14 inside the semiconductor device. The moulding resin 20 would be carbonized by the heat produced at that time, and at last caused to flame. Such flaming trouble is quite hazardous, damaging other electronic components used with the semiconductor device or leading to a fire, depending on the circumstances.

In order to analyze the flaming phenomena as mentioned above, the inventor has obtained the following test results. The inventor employed as samples power amplifiers with a moulding type power transistor with a collector dissipation of 3-watt class and moulding type integrated circuits for audio power amplifiers with the nominal output power at 3.5 watts. The output circuit and the ground circuit were short-circuited, and there was conducted a trial examination with 300 samples corresponding to respective supply voltages ranging from 12.5 Vdc to 17.5 Vdc. Approximately 2 sec after the application of the short-circuit, the semiconductor devices produced flames 40 mm to 50 mm high, and the flaming continued for a few seconds after the samples were cut off from the power supply. As a result of the analytical investigation of the samples after the trial examination, it was found that the moulding resin at portions in contact with the internal lead wire was carbonized. From this the inventor concluded that if the internal lead wire was cut off by an overcurrent, a current would flow through the carbonized portion to allow such portion to function just as a heater, thereby encouraging the flaming phenomenon.

On the other hand, if any mechanical strain stress remains in the moulding resin after moulding, no flaming trouble may be caused for any flow of overcurrent. Instead of the occurrence of such flaming trouble, a thermal expansion stress yielded by the production of heat produced by the overcurrent might combine with the remaining strain stress to break and disperse the moulding resin. Though the troubles attributable to such breakage is insignificant when compared with the flaming hazards, they are still harmful because any broken pieces of the resin scattered about would possibly damage the peripheral electronic components.

As described above, the semiconductor devices of the prior art construction as shown in FIGS. 1 and 2 are provided with no measure to counter those hindrances attributable to the overheating with the flow of overcurrent. These prior devices therefor have been subject to serious troubles, such as flaming.

An object of this invention is to provide a semiconductor device including a thermal fuse capable of securely preventing at low cost the package of the device from flaming or scattering due to any troubles, such as overheating due to an overcurrent, caused in the semiconductor device.

In order to attain the above object, the device of the invention is composed as follows. The invention comprises at least one semiconductor chip including a high power consumption portion, at least one thin lead wire connecting an external terminal with the semiconductor chip, the lead wire being possibly subjected to a large current, an electrically insulating soft material being adhered to at least one portion of the lead wire between the semiconductor chip and the external terminal, and an electrically insulating moulding material for moulding the semiconductor chip, lead wire, and soft material, the moulding material having a higher coefficient of thermal expansion than that of the soft material. In such construction, a thermal fuse is formed as a combination of the moulding resin, the soft material contained in the resin, and a portion of the thin lead wire encased in the soft material. Thus, the package of the device may securely be prevented from flaming or scattering due to overheating caused by overcurrent, and may be made at low cost because of the simple construction.

This invention can be more fully understood from the following detailed description when taken in conjunction with the accompanying drawings, in which:

FIG. 1 shows a sectional view of a moulding-type semiconductor device relating to a prior art;

FIG. 2 shows a sectional view of a moulding-type semiconductor device relating to another prior art;

FIG. 3 shows a sectional view of a moulding-type semiconductor device according to an embodiment of the invention;

FIG. 4 shows a perspective view of a mounting member; and

FIG. 5 shows a sectional view of a soft material encasing a portion of a lead wire which has been cut off by overheating and stretch stress.

Referring now to FIGS. 3 to 5, there will be described in detail an embodiment of this invention. Those parts which are used in common with the prior art devices will be denoted by the same numerals. In FIG. 3, a semiconductor chip 12 with a transistor structure or electrical circuit structure formed thereon is mounted on a mounting member 10 by means of solder or a mounting means composed of conductive epoxy cement. predetermined electrode portions 22 on the semiconductor chip 12 are connected with external terminals 16 by means of internal thin lead wires 24 respectively. Each electrode portion 22 is an aluminium-evaporated layer ohmic-contacted with a predetermined portion on the semiconductor chip 12. For the lead wires 24 ther may be used aurum (gold) or aluminium thin wires, or metal thin wires covered with aurum or aluminium, usually having a diameter of 25 $\mu$m to 100 $\mu$m. Each wire 24 is bonded and electrically connected with the aluminium layer of each electrode portion 22 and with a prescribed portion of each external terminal 16. The prescribed portion of the external terminal 16 corresponds to the free end portion of a connecting lead 32 as described hereinafter.

The wires 24 are each usually connected in a bent or curved state as shown in FIG. 3, though it may be connected in a substantially rectilinear shape depending upon the mechanism of the bonding tool. Then, a soft material 26 is adhered to a substantially middle portion of the wire 24, so constructed as described above. The material 26 encases the middle portion of the wire 24. This material 26 is to be in compliance with the following requirements. It is required that the material 26 has a relatively small coefficient of thermal expansion and an electrically insulating, non-carbonizing property. The material should neither prevent the expansion and contraction of the wire 24 encased by the material 26, i.e., the conglobation of the fused portion of the wire 24 by its surface tension when the wire 24 is fused, nor give off any substances adversely to affect the semiconductor chip 12 during the normal operation. The materials to comply with these requirements include, besides silicone rubber, two-liquid mixture type rubber (e.g. RTV-11 from GE, USA) and varnishes. The silicon rubber should preferably be used because of its easiness to handle. Since this silicon rubber is liquid before it is solidified, the adhesion of the silicon rubber or the soft material 26 to the thin lead wire 24 may be achieved by forming a droplet of the liquid silicon rubber on the tip of an injector needle and dripping the droplet onto a substantially middle portion of the wire 24 by means of an injector, for example.

Subsequently, the member 10, chip 12, wires 24, terminals 16, and materials 26 are moulded by the moulding resin 20. This resin 20 is to be in compliance with the following requirements. It is required to be formed of material that has a relatively large coefficient of thermal expansion and electrically insulating property, will never give off any substances adversely to affect the semiconductor chip 12 during the normal operation, and is suitable for moulding. The materials found to comply with these requirements include, for example, epoxy resin and silicon resin.

The mounting member 10, which is a metallic material with such structure as shown in FIG. 4, for example, before the semiconductor device is completed, is composed of a thick mounting portion 28 having a function to transmit the heat produced from the semiconductor chip 12 to the exterior, a plurality of parallel comblike connecting leads 32 each having one end connected at a right angle to a frame 30. One lead 32 is connected to the portion 28, and the leads 32 are left as free ends. The transverse connecting line 34 electrically and mechanically connects the ends of the connecting leads 32 i.e., opposite to the frame 30. Each of the connecting leads 32 is separated from the transverse connecting line 34 and the frame 30 after being moulded by the moulding resin 20, thereby forming the external terminals 16 as shown in FIG. 3.

In the aforementioned construction the combination of the moulding resin 20, soft materials 26 encasing a portion of the resin 20, and the thin lead wires 24 encased in the materials 26 forms the thermal fuses for the semiconductor device.

FIG. 5 shows schematically an example of the state of the thin lead wire 24 of aurum cut off inside the soft material 26 by overheating due to the overcurrent. According to the results of the trial examination, the inventor noticed that each tip end portion of the lead wire 24, as shown in FIG. 5, had been cut off and formed into a ball with a diameter somewhat larger than that of the lead wire 24. That is, the function as a thermal fuse is achieved inside the soft material 26.

Thus, one preferred embodiment of the semiconductor device according to the invention may be accomplished.

The aforementioned preferred construction resulted from ideas obtained according to the results of the various experiments conducted by the inventor in order to prevent the flaming troubles of the moulding type semiconductor device. Namely, the inventor found that the moulding resin around the internal lead wire carbonized to form a conductive path if the lead wire was fused by overheating due to a fixed current level or overcurrent. Accordingly, the inventor assumed that the conductive path should only be prevented from being formed by the carbonization. Then, the inventor believed that a porous moulding resin should be employed in order to prevent the formation of the conductive path due to the carbonization. However, the semiconductor chip must be completely enclosed against the open air to avoid adverse effects of the surroundings. Therefore, when using a porous moulding resin, it should be enclosed by other high-density material. To enclose the porous resin with the high-density material, however, is troublesome and not pragmatically feasible because it would reduce the distinctive feature of the method for manufacturing semiconductor devices according to the moulding method which has an advantage in mass-production at low cost.

Thereupon, in order to attain the aforesaid object, the inventor constructed the semiconductor device as follows. A droplet of the electrically insulating soft material with a small coefficient of thermal expansion is adhered to a substantially middle portion of each thin lead wire between each electrode portion of the semiconductor chip and the external terminal. Theoretically, the adhering position of the droplet may be located at any portion on the lead wire excepting the bonding parts of the external terminal and electrode portion. In order fully to give the lead wire the thermal stretch stress attributable to overheating, the adhering position of the droplet should preferably be located at the middle portion of the lead wire. Next, the semiconductor chip, one portion of the external terminals, the thin lead wires, and the soft materials are moulded by the moulding resin with a relatively large coefficient of thermal expansion. According to such construction, the flaming troubles and the dispersion of the package may securely be prevented if the semiconductor device is subjected to an overcurrent and the semiconductor chip and thin lead wire are overheated.

The theory of operation is as follows. The coefficient of thermal expansion of the soft material is smaller than that of the moulding resin, so that the soft material is compressed by the surrounding moulding resin when the semiconductor device is heated. The resultant compression of the soft material applies a stretch stress to the lead wire portion disposed inside the soft resin. Then, the thin lead wire, which has been softened or melted by the heating due to the overcurrent, is fused inside the soft material by the stretch stress produced inside the soft material before the moulding resin is carbonized, before flames develop, and before the moulding resin is broken and dispersed. On that occasion, the cut ends of inside the soft material are conglobated by the surface tension at fusion. Meanwhile, the moulding resin in contact with the thin lead wire at portions other than the soft material is carbonized by the overheating of the thin lead wire to form a carbonized layer around the thin lead wire. The carbonized layer is compressed by the thermal-expanded moulding resin and formed into a tubular electrical conductive layer. Since the soft material has an electrically insulating property, however, the semiconductor device will completely be cut off from the power supply at a point of time when the thin lead wire is cut off by the overheating, thus prohibiting further overheating.

The semiconductor device according to the invention includes the thermal fuse with the aforesaid construction, so that it may securely prevent the above-mentioned flaming hazards and dispersion of the package. Further, as the components additionally required for the effectuation of the invention include the soft material alone, the manufacturing cost may be substantially the same as that of the prior art moulding type semiconductor device.

As regards the flaming troubles, the inventor conducted the following trial examination. With 300 samples prepared for the respective test and with supply voltages ranging from 12.5 Vdc to 17.5 Vdc, the semiconductor devices with the constructions as shown in FIGS. 1 and 2 were subjected to an examination under fixed conditions. As a result, the incidence of flaming of these devices proved to be 1% and 70% respectively. Although the incidence of flaming of the construction of FIG. 1 at 1% may seem to be rather low, it still indicates the possibility of the flaming hazards which will lead to fires and other serious accidents, exhibiting quite a significant defect. On the other hand, according to the results of a trial examination conducted on the construction according to the invention as shown in FIG. 3 under the same conditions as aforesaid, the incidence of flaming was revealed to be 0%.

Variations and modifications may be made within the scope of this invention and portions of the improvements may be used without others.

What is claimed is:

1. A semiconductor device including a thermal fuse, comprising: at least one semiconductor chip including a high power consumption portion; at least one lead wire connecting an external terminal with an electrode portion of said semiconductor chip; an electrically insulating, non-carbonizable soft material being adhered to and encasing at least a portion of said lead wire between said electrode portion and said external terminal, said portion of said lead wire being fusible at a preselected threshold current; and an electrically insulating moulding material encapsulating said semiconductor chip, said lead wire, the portion of said external terminal which is connected to said lead wire, and said soft material.

2. A semiconductive device according to claim 1 wherein said soft material has a lower coefficient of thermal expansion than that of said moulding material.

3. A semiconductor device according to claim 1, wherein said soft material is a silicon rubber.

4. A semiconductor device according to claim 1, wherein said soft material is a rubber consisting of two kinds of fluid rubber.

5. A semiconductor device according to claim 1, wherein said soft material is a varnish.

6. A semiconductor device according to claim 1, wherein said moulding material is an epoxy resin.

7. A semiconductor device according to claim 1, wherein said moulding material is a silicon resin.

8. A semiconductor device according to claim 1, wherein said semiconductor chip is a power transistor.

9. A semiconductor device according to claim 1, wherein said semiconductor chip is an integrated circuit.

10. A thermal fuse in a semiconductor device in which a moulding material encapsulates a semiconductor chip and a portion of an external terminal into an integral molded unit comprising:
 a lead wire connecting the external terminal with an electrode portion of the semiconductor, a portion of said lead wire being fusible at a preselected threshold current and
 non-carbonizable, electrically insulating means encasing said portion of said lead wire for permitting the expansion and contraction of said wire, said lead wire and said non-carbonizable, electrically insulating means being encapsulated within the integral molded unit.

11. The thermal fuse of claim 10 wherein the non-carbonizable, electrically insulating means has a lower coefficient of thermal expansion than that of the moulding material.

12. The thermal fuse of claim 10 wherein said non-carbonizable, electrically insulating means is comprised of materials selected from the group consisting of silicon rubber, a rubber consisting of two kinds of fluid rubber, and a varnish.

13. The thermal fuse of claim 10 wherein said non-carbonizable, electrically insulating means is adhered to said lead wire in droplet form.

* * * * *